United States Patent
Jang

(10) Patent No.: US 9,066,445 B2
(45) Date of Patent: Jun. 23, 2015

(54) COOLING SYSTEM FOR ELECTRIC VEHICLE AND CONTROL METHOD THEREOF

(71) Applicant: LSIS CO., LTD., Anyang-si, Gyeonggi-do (KR)

(72) Inventor: Sung Jin Jang, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 91 days.

(21) Appl. No.: 13/889,289

(22) Filed: May 7, 2013

(65) Prior Publication Data

US 2013/0308270 A1   Nov. 21, 2013

(30) Foreign Application Priority Data

May 18, 2012 (KR) ......................... 10-2012-0053019

(51) Int. Cl.
*H05K 7/20* (2006.01)
*B60L 1/02* (2006.01)
*B60K 1/00* (2006.01)

(52) U.S. Cl.
CPC .............. *H05K 7/20281* (2013.01); *B60L 1/02* (2013.01); *B60K 2001/003* (2013.01)

(58) Field of Classification Search
CPC ....................... B60K 2001/003; H05K 7/20281
See application file for complete search history.

(56) References Cited

U.S. PATENT DOCUMENTS

| 5,678,760 A * | 10/1997 | Muso et al. ................... 237/2 A |
| 6,335,574 B1 * | 1/2002 | Ochiai et al. ................ 290/40 C |
| 6,492,741 B1 * | 12/2002 | Morimoto et al. .......... 290/40 C |
| 8,494,698 B2 * | 7/2013 | Murata et al. ................... 701/22 |
| 8,733,299 B2 * | 5/2014 | Cregut et al. ..................... 123/2 |

FOREIGN PATENT DOCUMENTS

| JP | 2006-264473 | 10/2006 |
| JP | 2011-017468 | 1/2011 |
| JP | 2011-182607 | 9/2011 |

OTHER PUBLICATIONS

Japan Patent Office Application Serial No. 2013-106252, Office Action dated Mar. 4, 2014, 2 pages.
Japan Patent Office Application Serial No. 2013-106252, Office Action dated Nov. 10, 2014, 3 pages.

* cited by examiner

*Primary Examiner* — John Q Nguyen
*Assistant Examiner* — Alan D Hutchinson
(74) *Attorney, Agent, or Firm* — Lee, Hong, Degerman, Kang & Waimey

(57) ABSTRACT

Disclosed are a cooling system for an electric vehicle and a control method thereof. The electric vehicle equipped with electronic parts including an electric motor. The electric vehicle includes a motor control unit to control the electric motor, a main control unit to control the electronic parts and the motor control unit, a water pump to circulate a cooling water cooling the electronic parts, the motor control unit, and the main control unit, and a temperature sensor to detect a temperature for an operation of the water pump and output the temperature to the motor control unit. The motor control unit generates a control signal to operate or stop the water pump according to a detection result of the temperature sensor.

8 Claims, 4 Drawing Sheets

Prior Art

COOLING SYSTEM FOR ELECTRIC VEHICLE AND CONTROL METHOD THEREOF

CROSS REFERENCE TO RELATED APPLICATION

Pursuant to 35 U.S.C. §119 (a), this application claims the benefit of earlier filing date and right of priority to Korean Patent Application No.10-2012-0053019, filed on May 18, 2012, the contents of which are hereby incorporated by reference in their entirety.

BACKGROUND

The embodiment relates to a cooling system for an electric vehicle and a control method thereof.

Recently, in order to prevent the driving cost of a vehicle from being increasing due to a high oil price, and reduce a contamination material produced when an internal combustion engine of a vehicle is operated, an electric vehicle, which is a transportation using an electric motor, or both of the electric motor and the internal combustion engine as driving power sources, has been spotlighted.

The electric vehicle uses an electric motor as a driving power source. In general, the electric vehicle operates the electric motor by using a rechargeable battery charged by an external charging unit as a power source. In the above electric vehicle, the electric motor and a motor control unit to control the electric motor are cooled by cooling water through a water-cooled scheme.

FIG. 1 is a block diagram showing the structure of a cooling system for an electric vehicle according to the related art.

Referring to FIG. 1, the electric vehicle according to the related art includes a plurality of electronic parts 2 including an electric motor 1. In addition, the operation of the electric motor 1 is controlled by a motor control unit 3. The motor control unit 3 includes a switching module 4 to turn on/turn off power applied to the electric motor 1 and a control module 5 to control the operation of the switching module 4. In addition, the electronic parts 2 and a main control unit 6 may be named an electric control unit (ECU) or a vehicle control unit (VCU).

The electric vehicle according to the related art includes a water pump 7 to cool the electronic parts 2, the motor control unit 3, and the main control unit 6, and a temperature sensor 8. The operation of the water pump 7 is controlled by the main control unit 6. In addition, if the water pump 7 is operated, cooling water circulates to cool the electronic parts 2, the motor control unit 3, and the main control unit 6. The temperature sensor 8 detects the temperature of the cooling water circulating by the water pump 7 to send the temperature of the cooling water to the main control unit 6.

However, the cooling system for the electric vehicle according to the related art has the following problems.

If the main control unit 6 controls even the operation of the water pump 7, the main control unit 6 controls several electronic parts 2. Accordingly, when the water pump 7 is controlled by the main control unit 6, a greater load may be applied to the main control unit 6.

In addition, as described above, as the greater load is applied to the main control unit 6, the main control unit 6 may be erroneously operated. In addition, when the main control unit 6 may be erroneously operated, the operation of the water pump 7 is not performed, so that the electronic parts 2 may be overheated, thereby causing the erroneous operation or the failure of a produce.

SUMMARY

The embodiment provides a cooling system for an electric vehicle capable of reducing a load applied to a main control unit, and a control method thereof.

The embodiment provides a cooling system for an electric vehicle capable of more correctly cooling parts, and a control method thereof.

According to the embodiment, there is provided an electric vehicle equipped with electronic parts comprising an electric motor. The electric vehicle includes a motor control unit to control the electric motor, a main control unit to control the electronic parts and the motor control unit, a water pump to circulate a cooling water cooling the electronic parts, the motor control unit, and the main control unit, and a temperature sensor to detect a temperature for an operation of the water pump and output the temperature to the motor control unit. The motor control unit generates a control signal to operate or stop the water pump according to a detection result of the temperature sensor.

DETAILED DESCRIPTION OF THE EMBODIMENTS

Figure 1:
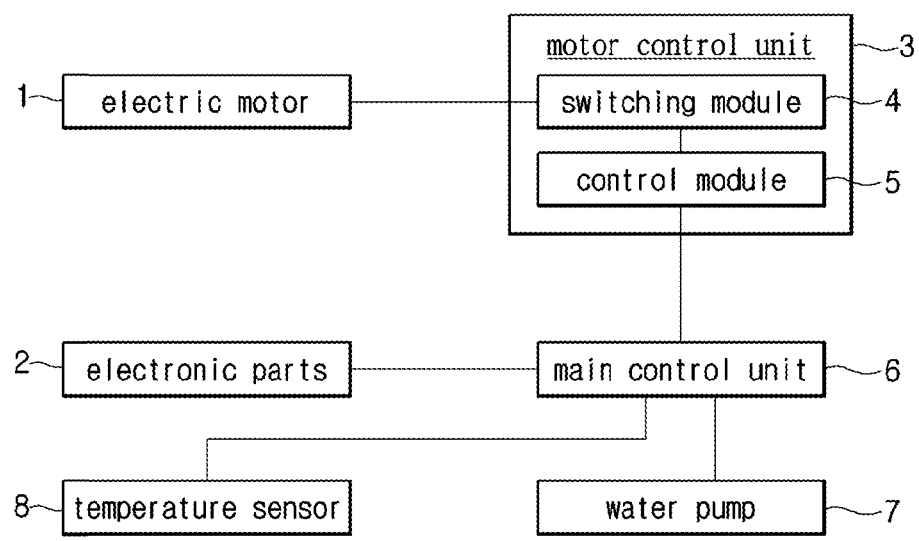
FIG. 1 is a block diagram showing a cooling system for an electric vehicle according to the related art.

Terms and words used in the specification and the claims shall not be interpreted as commonly-used dictionary meanings, but shall be interpreted as to be relevant to the technical scope of the invention based on the fact that the inventor may properly define the concept of the terms to explain the invention in best ways.

Therefore, the embodiments and the configurations depicted in the drawings are illustrative purposes only and do not represent all technical scopes of the embodiments, so it should be understood that various equivalents and modifications may exist at the time of filing this application.

Figure 2:
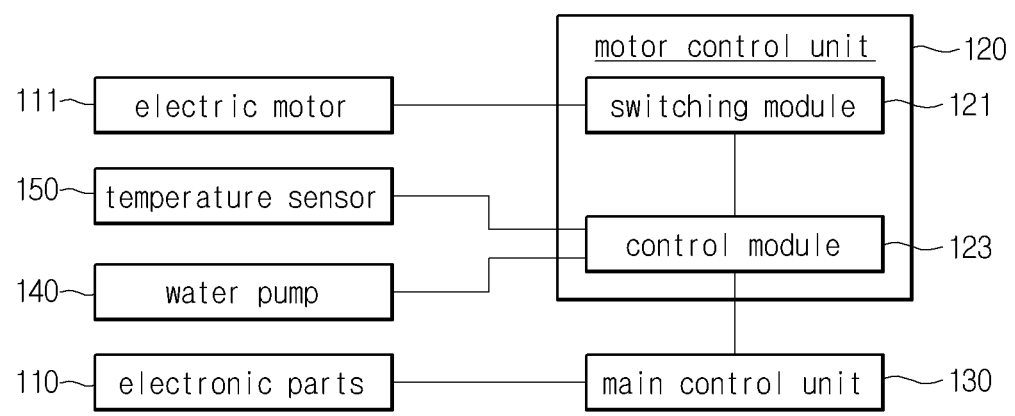
FIG. 2 is a block diagram showing a cooling system for an electric vehicle according to the first embodiment.

FIG. 2 is a block diagram showing a cooling system for an electric vehicle according to the first embodiment.

Referring to FIG. 2, the electric vehicle includes parts to drive the electric vehicle and a cooling system to cool the parts. In more detail, the electric vehicle according to the present embodiment includes electronic parts 110 including an electric motor 111, a motor control unit 120, a main control unit 130, a water pump 140, and a temperature sensor 150.

The electric motor 111 provides driving force to drive the electric vehicle. The electronic parts 110 include various parts for the operation of the electric vehicle. For example, the electronic parts 110 include components to drive the electric vehicle, a compressor for air condition, or parts to provide various conveniences.

The motor control unit 120 may control the operation of the electric motor 111. The motor control unit 120 may include a switching module 121 and a control module 123.

The switching module 121 may control on/off states of power supplied to the electric motor 111. The control module 123 may control the operation of the switching module 121 according to a control signal received from the main control unit 130.

In addition, according to the present embodiment, the control module 123 may control the operation of the water pump 140 according to a temperature value received from the temperature sensor 150. In other words, the control module 123 may generate a control signal to operate or stop the water pump 140 according to the temperature value received from the temperature sensor 150.

The main control unit 130 controls the operations of the electronic parts 110 and the motor control unit 120. For example, the main control unit 130 may send a control signal used to turn on/off the switching module 121 for the operation of the electric motor 111.

In addition, the water pump 140 circulates a cooling water to cool the electronic parts 110, the motor control unit 120, and the main control unit 130. The operation of the water pump 140 is controlled according to the control signal sent from the control module 123 of the motor control unit 120. In other words, if the water pump 140 is operated according to the control signal received therein from the motor control unit 120, the cooling water may circulate to cool the electronic parts 110.

Meanwhile, the temperature sensor 150 detects the temperature of the cooling water flowing by the water pump 140 or the temperature of the electronic parts 110. For example, the temperature sensor 150 may be mounted on a cooling water pipe (not shown) through which the cooling water circulates by the water pump 140, or may be mounted in the contact with or in adjacent to the electric motor 111 which is heated at a higher temperature among the electronic parts 110.

Hereinafter, the operation of the cooling system for the electric vehicle according to the first embodiment will be described.

In order to drive the electric vehicle, the main control unit 130 sends a control signal to the control module 123 of the motor control unit 120. In addition, the switching module 121 of the motor control unit 120 controls the operation of the electric motor 111 according to the control signal received from the main control unit 130, so that the electric vehicle can be driven. In other words, the voltage of a battery is applied to the electric motor 111 by the motor control unit 120, thereby providing power for the driving of the electric vehicle.

Meanwhile, the temperature sensor 150 detects the temperature and sends the information of the temperature to the motor control unit 120. In addition, the motor control unit 120 generates the control signal to operate the water pump 140 if the temperature received from the temperature sensor 150 exceeds a preset reference temperature. Accordingly, if the water pump 140 operates to circulate cooling water, the electronic parts 110 including the electric motor 111 may be cooled. In addition, if the temperature received from the temperature sensor 150 is less than the reference temperature, the motor control unit 120 generates the control signal to stop the water pump 140.

As described above, according to the present embodiment, the operation control of the water pump 140 is actually performed by the motor control unit 120. The load applied to the main control unit 130 is distributed to the motor control unit 120, so that the reliability in the operation of the main control unit 130 can be enhanced. The water pump 140 can be correctly controlled.

Hereinafter, the operation of the cooling system for the electric vehicle according to the second embodiment will be described.

Figure 3:
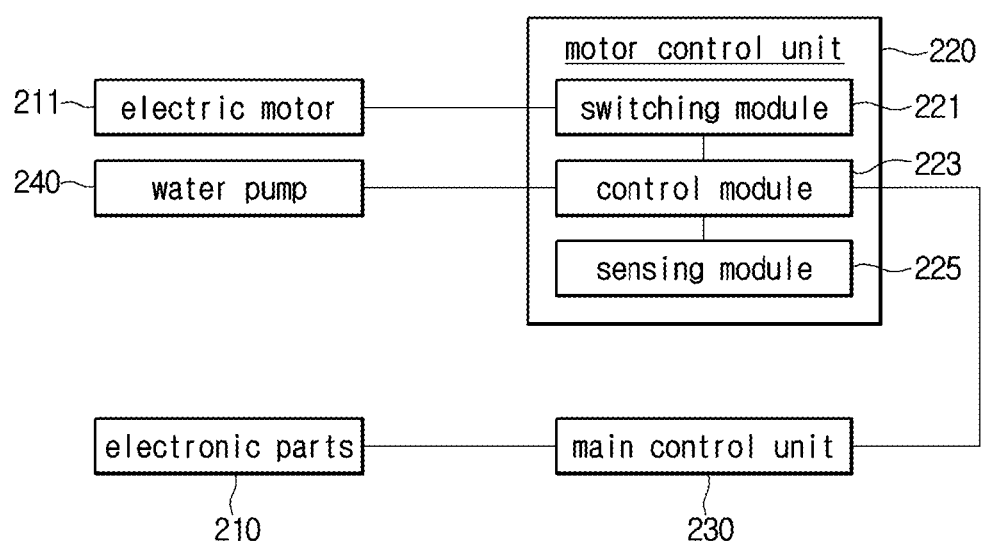
FIG. 3 is a block diagram showing a cooling system for an electric vehicle according to the second embodiment.

FIG. 3 is a block diagram showing a cooling system for an electric vehicle according to the second embodiment.

Referring to FIG. 3, an electric vehicle according to the present embodiment includes electronic parts 210 including an electric motor 211, a motor control unit 220, a main control unit 230, and a water pump 240. According to the present embodiment, the electronic parts 210, the main control unit 230, and the water pump 240 have structures similar to those of the first embodiment. The second embodiment may have structure in which the motor control unit 220 further includes a sensing module 225 without the temperature sensor 150 in the first embodiment. The sensing module 225 may detect the temperatures of the motor control unit 220 and the switching module 221 serving as high temperature components. In addition, the control module 223 may control the operation of the water pump 240 according to the temperature detected by the sensing module 225. According to the second embodiment, the motor control unit 220 includes the sensing module 225 to detect the temperature used to control the operation of the water pump 240. Therefore, since the number of part required to be separately, installed is reduced, manufacturing is simplified.

Hereinafter, the operation of the cooling system for the electric vehicle according to the third embodiment will be described.

Figure 4:
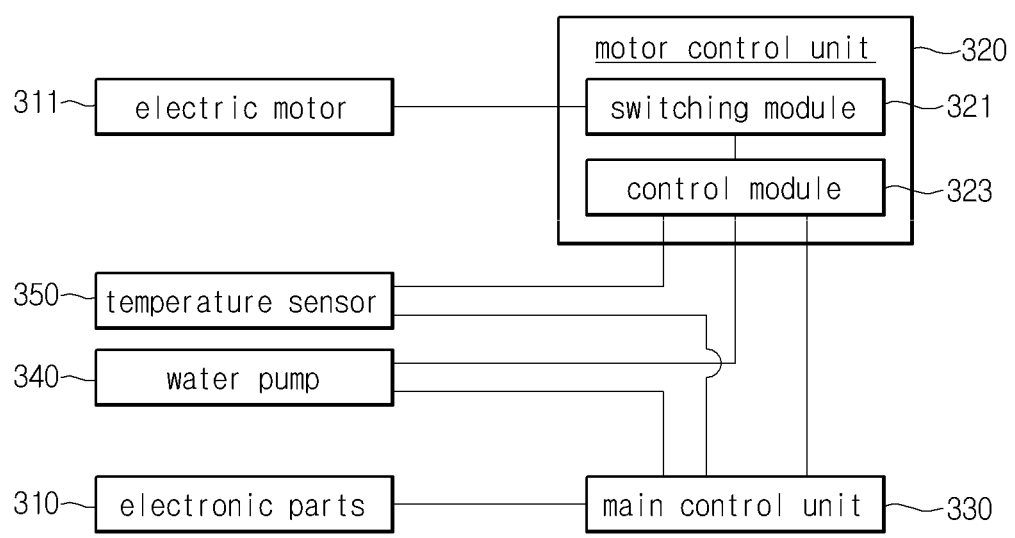
FIG. 4 is a block diagram showing a cooling system for an electric vehicle according to the third embodiment.

FIG. 4 is a block diagram showing a cooling system for an electric vehicle according to the third embodiment.

Referring to FIG. 4, the operation of a water pump 340 according to the present embodiment is controlled by a motor control unit 320. In more detail, the motor control unit 320 primarily controls the operation of the water pump 340 according to the temperature detected by a temperature sensor 350. In addition, the motor control unit 320 may determine if a preset time elapses after the water pump 340 has been operated. If the temperature detected by the temperature sensor 350 is not reduced or continuously reduced according to the determination result, the main control unit 330 may control the operation of the water pump 340.

For example, if the temperature detected by the temperature sensor 350 exceeds a preset reference temperature, the motor control unit 350 may generate a control signal to operate the water pump 340. Accordingly, the water pump 340 operates, so that the parts may be cooled by the cooling water circulating due to the operation of the water pump 340.

However, if the temperature detected by the temperature sensor 350 is not reduced even though a preset first reference time elapses after the motor control unit 320 generates the control signal to operate the water pump 340, the motor control unit 320 may determine that the water pump 340 does not operate. That is to say, in the above case, the water pump 340 may not be determined as being correctly controlled by the motor control unit 320. Accordingly, if the temperature detected by the temperature sensor 350 is not reduced even though a preset first reference time elapses after the motor control unit 320 generates the control signal to operate the water pump 340, the main control unit 330 may additionally generate a control signal to operate the water pump 340.

To the contrary, if the temperature detected by the temperature sensor 350 is less than the reference temperature, the motor control unit 320 generates a control signal to stop the water pump 340. If the temperature detected by the temperature sensor 350 is continuously detected even though a preset second reference time elapses after the control signal to stop the water pump 340 has been generated, the motor control unit 320 may determine that the water pump 340 continuously operates without stopping. Accordingly, in the above case, the main control unit 330 may generate to a control signal to stop the water pump 340.

Even the motor control unit 320 according to the present embodiment may include a switching module 321 and a control module 323 to control the electric motor 311 similarly to those of the first embodiment. In addition, the present embodiment is the same as the first and second embodiments in that the operations of the electronic parts 310 and the motor control unit 320 may be controlled by the main control unit 330.

As described above, although various examples have been illustrated and described, the present disclosure is not limited to the above-mentioned examples and various modifications can be made by those skilled in the art without departing from the scope of the appended claims. In addition, these modified examples should not be appreciated separately from technical spirits or prospect

What is claimed is:

1. An electric vehicle equipped with electronic parts including an electric motor, the electric vehicle comprising:
   a motor control unit to control the electric motor;
   a main control unit to control the electronic parts and the motor control unit;
   a water pump to circulate water to cool the electronic parts, the motor control unit, and the main control unit; and
   a temperature sensor to detect temperature and provide the detected temperature to the motor control unit,
   wherein the motor control unit primarily controls the water pump to operate according to the detected temperature and determines whether the detected temperature is reduced, and
   wherein the main control unit secondarily controls the water pump to operate if the motor control unit determines that the detected temperature is not reduced after the motor control unit has primarily controlled the water pump to operate.

2. The electric vehicle of claim 1, wherein the main control unit secondarily controls the water pump to operate by generating a control signal if a temperature value detected by the temperature sensor is not reduced a predetermined period of time after the motor control unit has primarily controlled the water pump to operate.

3. The electric vehicle of claim 1, wherein the main control unit generates a control signal to stop the operation of the water pump if a temperature value detected by the temperature sensor is reduced after the motor control unit has secondarily controlled the water pump to operate.

4. The electric vehicle of claim 1, wherein the motor control unit comprises:
   a switching module to selectively apply power of a battery to the electric motor; and
   a control module to control an operation of the switching module.

5. The electric vehicle of claim 1, wherein the temperature sensor is provided at least on at least a cooling pipe or at a position adjacent to the electric motor.

6. The electric vehicle of claim 1, wherein the motor control unit comprises:
   a switching module to selectively apply power of a battery to the electric motor;
   a sensing module to detect a temperature of the switching module; and
   a control module to control the water pump according to the detected temperature of the switching module.

7. The electric vehicle of claim 1, wherein the motor control unit generates at least one control signal to operate the temperature sensor and the water pump.

8. The electric vehicle of claim 1, wherein the motor control unit and the main control unit each generates a control signal to operate the temperature sensor and the water pump.

* * * * *